(12) United States Patent
Zhou

(10) Patent No.: US 10,354,580 B2
(45) Date of Patent: Jul. 16, 2019

(54) INTEGRATED LED DISPLAY AND FABRICATION METHOD THEREOF

(71) Applicant: United Microelectronics Corp., Hsinchu (TW)

(72) Inventor: Zhi-Biao Zhou, Singapore (SG)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 15/698,221

(22) Filed: Sep. 7, 2017

(65) Prior Publication Data
US 2019/0073943 A1  Mar. 7, 2019

(51) Int. Cl.
| | |
|---|---|
| H01L 25/16 | (2006.01) |
| H01L 33/62 | (2010.01) |
| H01L 25/075 | (2006.01) |
| G09G 3/32 | (2016.01) |
| H03K 17/041 | (2006.01) |
| H01L 21/8238 | (2006.01) |

(52) U.S. Cl.
CPC ........... *G09G 3/32* (2013.01); *H01L 21/8238* (2013.01); *H01L 25/0753* (2013.01); *H01L 25/167* (2013.01); *H01L 33/62* (2013.01); *H03K 17/04106* (2013.01)

(58) Field of Classification Search
CPC .................................................. H01L 21/8238
See application file for complete search history.

(56) References Cited

U.S. PATENT DOCUMENTS 7,973,329 B2   7/2011  Lee
2017/0179097 A1 *  6/2017  Zhang ..................... H01L 25/50

* cited by examiner

*Primary Examiner* — William A Harriston
(74) *Attorney, Agent, or Firm* — J.C. Patents

(57) ABSTRACT

An integrated LED display is provided. The integrated LED display includes a complementary metal-oxide-semiconductor (CMOS) wafer including a driver circuitry fabricated on a substrate. Further, an insulating layer is disposed over the CMOS wafer. A conductive semiconductor layer is disposed on the insulating layer. A LED array is disposed on the conductive semiconductor layer and the LED array connected to the driver circuitry. The LED array includes a photo device array, disposed on the conductive semiconductor layer, and a switch device array, disposed on the conductive semiconductor layer.

20 Claims, 3 Drawing Sheets

INTEGRATED LED DISPLAY AND FABRICATION METHOD THEREOF

BACKGROUND

1. Field of the Invention

The present invention generally relates to semiconductor fabrication, and particularly to an integrated LED display and the fabrication method thereof.

2. Description of Related Art

To display an image, the light emitting diode (LED) array is usually used to emit the color lights. The LED array includes a plurality of LED devices, which can be fabricated by reduced size to have higher image resolution while the display size can still remain small. Particularly, when the 3D displaying effect is intended, the image resolution and the response speed of the LED device is definitely needed to improve.

In the further development, such as application of virtual reality (VR), it needs really high image resolution, such as 4K, 8K or more, with high response speed of the LED devices, such as 120 Hz, 240 Hz or more. The VR apparatus is usually wearing on head, the weight is also a consideration in design.

In VR application as an example, the thin film transistor (TFT) may be used to drive the LED device but the driving capability of TFT cannot efficiently support the need in VR application.

SUMMARY OF THE INVENTION

The invention provides an integrated LED display and the fabrication method thereof. The size of the LED device can be effectively reduced to have high image resolution. Also, the diving speed of the LED device in the whole LED display can maintain in high operation speed, such as 120 Hz or more.

In an embodiment, the invention provides an integrated LED display includes a complementary metal-oxide-semiconductor (CMOS) wafer including a driver circuitry fabricated on a substrate. Further, an insulating layer is disposed over the CMOS wafer. A conductive semiconductor layer is disposed on the insulating layer. A LED array is disposed on the conductive semiconductor layer and the LED array connected to the driver circuitry. The LED array includes a photo device array, disposed on the conductive semiconductor layer, and a switch device array, disposed on the conductive semiconductor layer.

In an embodiment, as to the integrated LED display, the switch device array is a high-speed switch array, connected to the photo device array.

In an embodiment, as to the integrated LED display, the conductive semiconductor layer is a conductive oxide semiconductor layer or a silicon layer.

In an embodiment, as to the integrated LED display, the switch device array (114) comprises a plurality of oxide semiconductor (OS) field effect transistors (FET), serving as switches, controlled by the driver circuitry.

In an embodiment, as to the integrated LED display, the driver circuitry comprises a LED driver and a communication circuitry.

In an embodiment, as to the integrated LED display, the LED driver drives the switch device array and the photo device array to emit an image light.

In an embodiment, as to the integrated LED display, the photo device array comprises a plurality of LED devices for respectively emitting primary color lights.

In an embodiment, as to the integrated LED display, the CMOS wafer further comprises an interconnect structure and an insulating layer to insulate the driver circuitry and the interconnect structure.

In an embodiment, the invention provides a method for fabricating an integrated light emitting diode (LED) display. The method comprises providing a complementary metal-oxide-semiconductor (CMOS) wafer comprising a driver circuitry fabricated on a substrate. Further still, an insulating layer is formed over the CMOS wafer. A conductive semiconductor layer is formed on the insulating layer. A LED array is formed over the conductive semiconductor layer and the LED array connected to the driver circuitry. The LED array comprises: a photo device array disposed on the conductive semiconductor layer, and a switch device array disposed on the conductive semiconductor layer.

In an embodiment, as to the method, the switch device array is fabricated as a high-speed switch array, connected to the photo device array.

In an embodiment, as to the method, the conductive semiconductor layer is fabricated as a conductive oxide semiconductor layer or a silicon layer.

In an embodiment, as to the method, the switch device array is fabricated, comprising a plurality of oxide semiconductor (OS) field effect transistors (FET), serving as switches, controlled by the driver circuitry.

In an embodiment, as to the method, the driver circuitry comprises a LED driver and a communication circuitry.

In an embodiment, as to the method, the LED driver is fabricated to drive the switch device array and the photo device array to emit an image light.

In an embodiment, as to the method, the photo device array is fabricated comprising a plurality of LED devices for respectively emitting primary color lights.

In an embodiment, as to the method, the CMOS wafer is fabricated further comprising an interconnect structure 104 and an insulating layer to insulate the driver circuitry and the interconnect structure.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The invention is directed to a semiconductor device with two circuit parts respectively formed on a front side and a back side with respective to an insulating layer from a SOI structure.

The integrated LED display have a first side and a second side. The first side can be treated as a front side as an example while the second side can be treated as the back side. The LED array is formed at the first side and the CMOS circuitry is formed the second side. The first side and the second side are joined by an insulating layer. In this situation, the LED array with the switch array can be fabricated in high density. The LED device with the switch device can be operated in fast speed. It is helpful to improve the driving capability and then can reach the target for refreshing the image in higher frequency.

The switch device for driving the LED device can be oxide semiconductor (OS) field effect transistors (FET) formed on the conductive oxide semiconductor layer, so that the density and the mobility can be improved and then can be adapted to the display apparatus with high resolution (such as VR or 8K resolution in an example) and high refresh rate (eg. at least 120 Hz).

In general aspect, an integrated LED display is provided. The integrated LED display includes a complementary metal-oxide-semiconductor (CMOS) wafer including a driver circuitry fabricated on a substrate. Further, an insulating layer is disposed over the CMOS wafer. A conductive semiconductor layer is disposed on the insulating layer. A LED array is disposed on the conductive semiconductor layer and the LED array connected to the driver circuitry. The LED array includes a photo device array, disposed on the conductive semiconductor layer, and a switch device array, disposed on the conductive semiconductor layer.

Multiple embodiments are provided as the examples for describing the invention. However, the invention is not just limited to the embodiments as provided.

Figure 1:
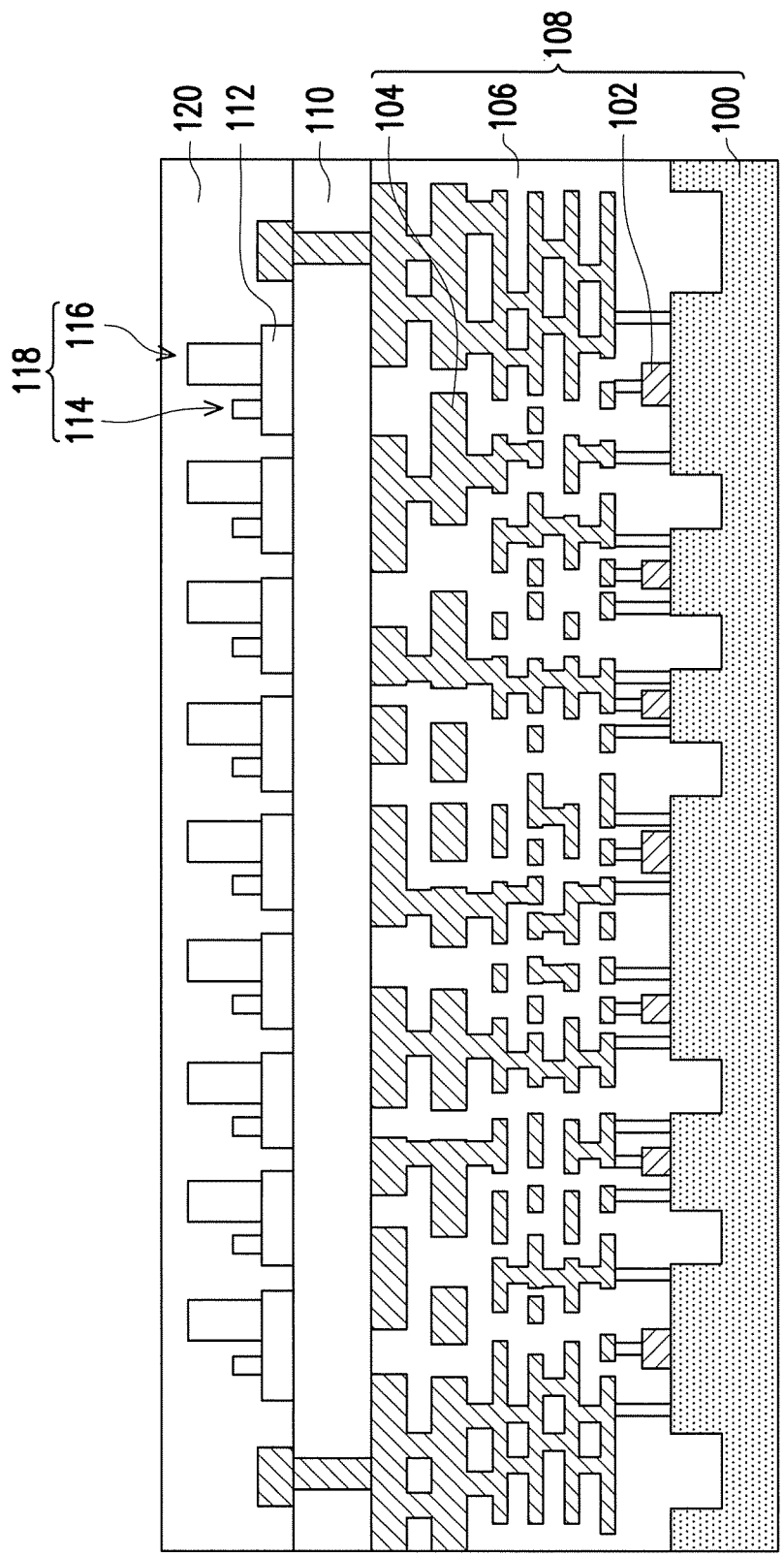
FIG. 1 is a drawing of cross-section structure, schematically illustrating the integrated LED display, according to an embodiment of the invention.

FIG. 1 is a drawing of cross-section structure, schematically illustrating the integrated LED display, according to an embodiment of the invention. A substrate 100 is provided as the base for fabricating various semiconductor structures over the substrate 100. In the embodiment, a driving circuitry 102, as simply represented by a transistor in the example, can be formed over the substrate 100, which is silicon substrate in an example. The driving circuitry 102 can include the LED driver and the communication circuitry, which can communicate with external host to display the image. The detail would be described in FIG. 3 as well.

The driving circuitry 102 includes various structure elements, which are fabricated layer by layer according to the semiconductor fabrication process, including deposing layer and photolithographic process and etching process to pattern the structure. Further, the interconnect structure 104 in multiple levels is also needed to be formed so to connected to the LED array 118. The insulating layer 106 in stacked structure is insulating the driving circuitry 102 and the interconnect structure 104. The material of the insulating layer 106 is dielectric material, mainly including silicon oxide. However, a small portion of nitride material may also be included.

The actual structures for the substrate 100, the driving circuitry 102, the interconnect structure 104 and the insulating layer 106 is depending on the actual design of the integrated circuit. These layers can be referred as a CMOS wafer 108. In dual-side fabrication procedure as an example, the CMOS wafer 108 as the back side can be fabricated independently. The front side including the LED array 118 can be separately fabricated. The front side and the back side are then joined together. However, the invention is not just limited to this manner.

From the structure point of view, after the CMOS wafer 108 has been fabricated and provided, another insulating layer 110 is disposed over the CMOS wafer 108. The interconnect structure 104 is extending through the insulating layer 110 so to connected to the front side.

Then, a conductive semiconductor layer 112 is disposed on the insulating layer 110. The conductive semiconductor layer 112 in an example can be a silicon layer or a conductive OS layer. The silicon layer forms a structure of silicon on insulating (SOI) structure. Alternatively, the material of the conductive OS layer in an example can be In—Ga—Zn—O (IGZO) or the similar materials, like In—Zn—O (IZO), In—Ga—O (IGO), Zn—Sn—O (ZTO), In—Sn—Zn—O (ITZO), Hf—In—Zn—O (HIZO), or Al—Zn—Sn—O (AZTO). The oxide semiconductor serving as the channel of FET can have faster mobility, so the improve the operation of the switch device array 114.

The LED array 118 is then disposed on the conductive semiconductor layer 112 and the LED array 118 is connected to the driver circuitry 102 through the interconnect structure 104.

Here, the LED array 118 can comprise a photo device array 116 and a switch device array 114. The photo device array 116 is disposed on the conductive semiconductor layer 112. The switch device array 114 is disposed on the conductive semiconductor layer 112. The actual structures for the LED array 118 including the switch device array 114 and the photo device array 116 are representatively shown in drawing and is determined by the actual design, without limiting to the specific structure. The insulating layer 120 is also included to insulate the LED array 118. The insulating layer 120 is dielectric layer and may include silicon oxide and other dielectric material without limiting to.

The switch device array 114 includes a plurality of switch devices, corresponding to the display pixels. The photo device array 116 also includes a plurality of LED devices corresponding to the display pixels. In other words, one switch device is matching to one LED device to corresponding to one pixel.

Figure 2:
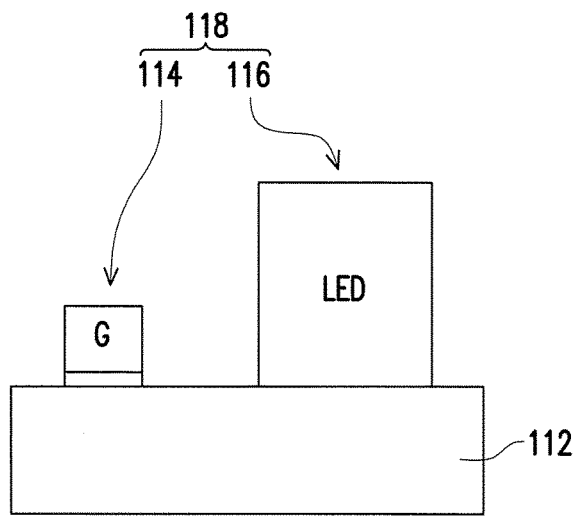
FIG. 2 is a drawing of cross-section structure, schematically illustrating the LED array, according to an embodiment of the invention.

FIG. 2 is a drawing of cross-section structure, schematically illustrating the LED array, according to an embodiment of the invention. Referring to FIG. 2, the structure of the LED array 118 in an example is described. The photo device of the photo device array 116 is an LED device an example. As known in an example, the LED device may include a first electrode, a P-conductive semiconductor layer, an active layer and a N-conductive layer. In further option, the photo device array 116 may be formed by a higher level without directly disposing on the conductive semiconductor layer 112.

The switch device of the switch device array 114 can be a FET of which the gate electrode G is shown. If the conductive semiconductor layer 112 is the silicon layer then the source region and the drain region can be formed in the silicon layer. However, if the conductive semiconductor layer 112 is the OS layer, the source region and the drain region can be additionally formed on the conductive semiconductor layer 112. The invention is not limited to a specific design. The gate electrode G is representatively shown for the switch devices of the switch device array 114. The source region and the drain region, which may have various options in structure, are not explicitly shown.

The switch device array 114 and the photo device array 116 are connected and driven by a LED driver included in the driving circuitry 102, so to turn on the switch device and provide gray level signal to emit the color light.

Figure 3:
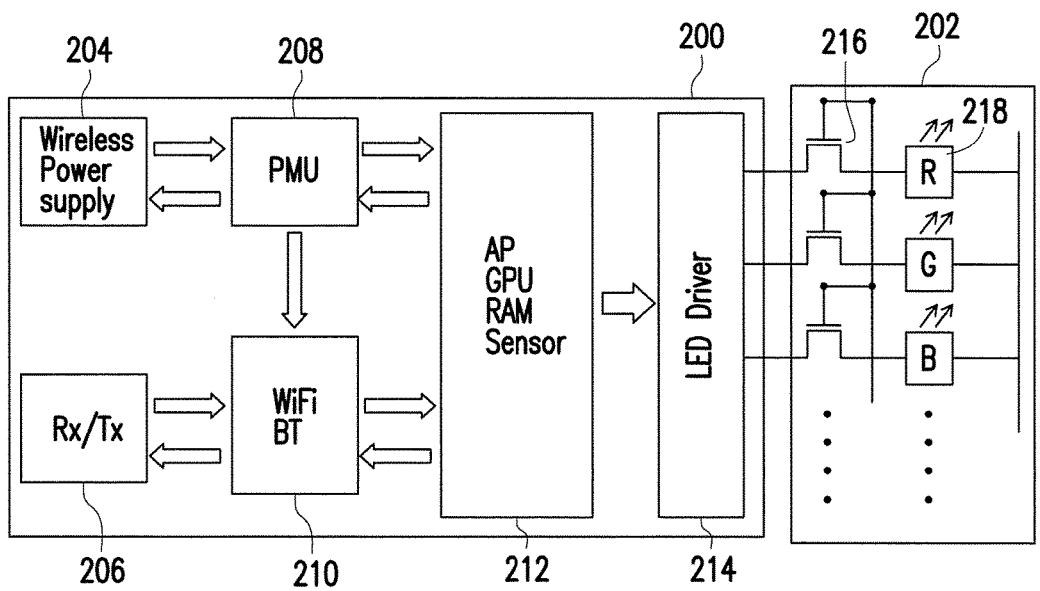
FIG. 3 is a drawing, schematically illustrating the integrated LED display in circuitry block diagram, according to an embodiment of the invention.

FIG. 3 is a drawing, schematically illustrating the integrated LED display in circuitry block diagram, according to an embodiment of the invention. Referring to FIG. 3, The LED array 202 can be corresponding to the LED array 118 in FIG. 1 and the CMOS circuitry 200 can be corresponding to the CMOS wafer 108 including the driving circuitry 102 in FIG. 1, as the example. The first side circuitry 202 includes switch devices 216 and the LED devices 218. The LED devices 218 are connected to the switch devices 216 to respectively emit the color lights of red (R), green (G) or blue (B) at the given grey level.

The CMOS circuitry 200 includes a LED driver 214 to drive the LED array 202 to display an image. However, the image data is imputed from the circuit block 212. In an example, the circuit block 212 may include access point (AP), graphics processing unit (GUP), RAM device, or sensor. Further in an example, a wireless power supply 204, a data interface 206 for receiving data (Rx) and transmitting data (Tx), a power management unit (PMU) 208, and/or a wireless communication unit 210 including WiFi or blue tooth (BT) may be included. In the VR application of the integrated LED display, the whole set of VR apparatus can be worn on the head for operating various function. The circuit units in the CMOS circuitry 200 other than the LED driver 214 may be generally or partially referred as a communication circuitry.

The integrate LED display in the invention has involved the conductive semiconductor layer 112 for at least serving the channel of FET, the FET can be operated in faster speed and can be fabricated in small size. In the application to VR apparatus as an example, the image quality can be improved and the weight of the VR apparatus can be reduced.

Figure 4:
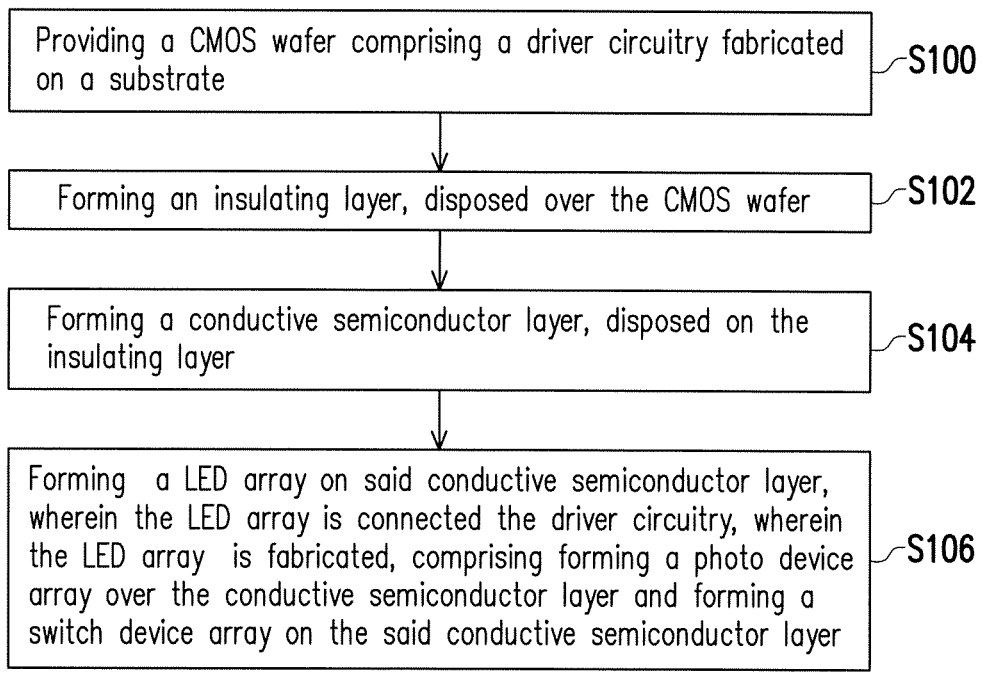
FIG. 4 is a drawing, schematically illustrating the process flow of the method for fabricating the integrated LED display, according to an embodiment of the invention.

FIG. 4 is a drawing, schematically illustrating the process flow of the method for fabricating the integrated LED display, according to an embodiment of the invention. As to the fabrication method, the invention provides a method for fabricating an integrated light emitting diode (LED) display. The method comprises providing a complementary metal-oxide-semiconductor (CMOS) wafer comprising a driver circuitry fabricated on a substrate (step S100). Further still, an insulating layer is formed over the CMOS wafer (step S102). A conductive semiconductor layer is formed on the insulating layer (step S104). A LED array is formed over the conductive semiconductor layer and the LED array connected to the driver circuitry (S106). The LED array is fabricated to comprise a photo device array disposed on the conductive semiconductor layer, and a switch device array disposed on the conductive semiconductor layer.

In an embodiment, as to the method, the switch device array 118 is fabricated as a high-speed switch array, connected to the photo device array.

In an embodiment, as to the method, the conductive semiconductor layer 112 is fabricated as a conductive oxide semiconductor layer or a silicon layer.

In an embodiment, as to the method, the switch device array 118 is fabricated, comprising a plurality of oxide semiconductor (OS) field effect transistors, serving as switches, controlled by the driver circuitry.

In an embodiment, as to the method, the driver circuitry 102 comprises a LED driver and a communication circuitry.

In an embodiment, as to the method, the LED driver is fabricated to drive the switch device array and the photo device array to emit an image light.

In an embodiment, as to the method, the photo device array is fabricated comprising a plurality of LED devices for respectively emitting primary color lights.

In an embodiment, as to the method, the CMOS wafer 108 is fabricated further comprising an interconnect structure 104 and an insulating layer 106 to insulate the driver circuitry 102 and the interconnect structure 104.

The switch device array 114 can be fabricated based on conductive semiconductor layer 112 to at least form the FET, in which the conductive semiconductor layer 112 is the silicon layer in a SOI or the conductive oxide semiconductor, such as IGZO as so on. The switch device can be operated in high speed, faster than the conventional TFT.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An integrated light emitting diode (LED) display, comprising:
   a complementary metal-oxide-semiconductor (CMOS) wafer comprising a driver circuitry fabricated on a substrate;
   an insulating layer, disposed over the CMOS wafer;
   a conductive semiconductor layer, disposed on the insulating layer; and
   a LED array, disposed on the conductive semiconductor layer and the LED array connected to the driver circuitry,
   wherein the LED array comprises:
   a photo device array, disposed on the conductive semiconductor layer; and
   a switch device array, disposed on the conductive semiconductor layer.

2. The integrated LED display of claim 1, wherein the switch device array is a high-speed switch array, connected to the photo device array.

3. The integrated LED display of claim 1, wherein the conductive semiconductor layer is a conductive oxide semiconductor layer or a silicon layer.

4. The integrated LED display of claim 1, wherein the switch device array comprises a plurality of oxide semiconductor field effect transistors, serving as switches, controlled by the driver circuitry.

5. The integrated LED display of claim 1, wherein the driver circuitry comprises a LED driver and a communication circuitry.

6. The integrated LED display of claim 5, wherein the LED driver drives the switch device array and the photo device array to emit an image light.

7. The integrated LED display of claim 1, wherein the photo device array comprises a plurality of LED devices for respectively emitting primary color lights.

8. The integrated LED display of claim 1, wherein the CMOS wafer further comprises an interconnect structure and an insulating layer to insulate the driver circuitry and the interconnect structure.

9. The integrated LED display of claim 1, wherein the conductive semiconductor layer is direct contact on the disposed on the insulating layer.

10. The integrated LED display of claim 1, wherein the conductive semiconductor layer provides a semiconductor structure part of the LED array.

11. A method for fabricating an integrated light emitting diode (LED) display, comprising:
    providing a complementary metal-oxide-semiconductor (CMOS) wafer comprising a driver circuitry fabricated on a substrate;
    forming an insulating layer over the CMOS wafer;
    forming a conductive semiconductor layer on the insulating layer; and forming a LED array over the conductive semiconductor layer and the LED array connected to the driver circuitry, wherein the LED array comprises: a photo device array, disposed on the conductive semiconductor layer; and a switch device array, disposed on the conductive semiconductor layer.

12. The method of claim 11, wherein the switch device array is fabricated as a high-speed switch array, connected to the photo device array.

13. The method of claim 11, the conductive semiconductor layer is fabricated as a conductive oxide semiconductor layer or a silicon layer.

14. The method of claim 11, wherein the switch device array is fabricated, comprising a plurality of oxide semiconductor field effect transistors, serving as switches, controlled by the driver circuitry.

15. The method of claim 11, wherein the driver circuitry comprises a LED driver and a communication circuitry.

16. The method of claim 15, wherein the LED driver is fabricated to drive the switch device array and the photo device array to emit an image light.

17. The method of claim 11, wherein the photo device array is fabricated comprising a plurality of LED devices for respectively emitting primary color lights.

18. The method of claim 11, wherein the CMOS wafer is fabricated further comprising an interconnect structure and an insulating layer to insulate the driver circuitry and the interconnect structure.

19. The method of claim 11, wherein the conductive semiconductor layer is formed direct contact on the disposed on the insulating layer.

20. The method of claim 11, wherein the conductive semiconductor layer provides a semiconductor structure part of the LED array.

* * * * *